(12) United States Patent
Lee

(10) Patent No.: US 11,250,812 B2
(45) Date of Patent: Feb. 15, 2022

(54) LUMINANCE CORRECTION METHOD AND LUMINANCE CORRECTION DEVICE FOR DISPLAY PANEL

(71) Applicant: HKC CORPORATION LIMITED, Shenzhen (CN)

(72) Inventor: Chia-Hang Lee, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/982,560

(22) PCT Filed: Dec. 7, 2018

(86) PCT No.: PCT/CN2018/119672
§ 371 (c)(1),
(2) Date: Sep. 19, 2020

(87) PCT Pub. No.: WO2020/082519
PCT Pub. Date: Apr. 30, 2020

(65) Prior Publication Data
US 2021/0005161 A1    Jan. 7, 2021

(30) Foreign Application Priority Data
Oct. 22, 2018    (CN) .......................... 201811231616.4

(51) Int. Cl.
*G09G 5/10* (2006.01)
*G06F 17/18* (2006.01)

(52) U.S. Cl.
CPC .............. *G09G 5/10* (2013.01); *G06F 17/18* (2013.01); *G09G 2320/0646* (2013.01); *G09G 2320/0673* (2013.01)

(58) Field of Classification Search
CPC ... G09G 2320/0646; G09G 2320/0673; G09G 5/10; G06F 17/18
See application file for complete search history.

(56) References Cited

U.S. PATENT DOCUMENTS 10,923,053 B2 *  2/2021  Chen .................... G09G 3/3607
2010/0013750 A1  1/2010  Kerofsky et al.
(Continued)

FOREIGN PATENT DOCUMENTS

CN    102024439 A    4/2011
CN    104361873 A    2/2015
(Continued)

OTHER PUBLICATIONS

Yue Zhang, the ISA written comments, Jul. 2019, CN.
Yue Zhang, the International Search Report, dated Jul. 2019, CN.

*Primary Examiner* — Amare Mengistu
*Assistant Examiner* — Jennifer L Zubajlo

(57) ABSTRACT

A luminance correction method and correction device for a display panel are disclosed. The luminance correction method for a display panel includes the following steps: collecting full-picture optical information; calculating, according to the full-picture optical information of a high-gray level picture and the full-picture optical information of a low-gray level picture, target optical luminance values corresponding to medium-gray level pictures; and comparing the full-picture optical information of the medium-gray level pictures with a target optical luminance value corresponding to a current medium-gray level picture, and obtaining a gray level correction matrix corresponding to a current gray level.

14 Claims, 8 Drawing Sheets

(56) References Cited

U.S. PATENT DOCUMENTS

| | | | |
|---|---|---|---|
| 2016/0351139 A1* | 12/2016 | Syu | G09G 3/36 |
| 2018/0144716 A1* | 5/2018 | Jung | G09G 3/3208 |
| 2018/0204529 A1* | 7/2018 | Chen | G09G 3/006 |
| 2020/0184912 A1* | 6/2020 | Wang | G09G 3/3607 |
| 2021/0125545 A1* | 4/2021 | Sohn | G09G 3/32 |

FOREIGN PATENT DOCUMENTS

| | | |
|---|---|---|
| CN | 105244007 A | 1/2016 |
| CN | 106023916 A | 10/2016 |
| CN | 106384573 A | 2/2017 |
| CN | 107068037 A | 8/2017 |

\* cited by examiner

LUMINANCE CORRECTION METHOD AND LUMINANCE CORRECTION DEVICE FOR DISPLAY PANEL

CROSS REFERENCE OF RELATED APPLICATIONS

This application claims the priority to the Chinese Patent Application No. CN201811231616.4, filed with National Intellectual Property Administration, PRC on Oct. 22, 2018 and entitled "LUMINANCE CORRECTION METHOD AND LUMINANCE CORRECTION DEVICE FOR DISPLAY PANEL", which is incorporated herein by reference in its entirety.

TECHNICAL FIELD

This application relates to the field of display technologies, and in particular, to a luminance correction method and a luminance correction device for a display panel.

BACKGROUND

Statement herein merely provides background information related to this application and does not necessarily constitute the existing technology.

With development and advancement of science and technologies, due to hot spots such as thinness, power saving, and low radiation, liquid crystal displays become mainstream products of displays and are widely applied. A flat panel display includes a Thin Film Transistor-Liquid Crystal Display (TFT-LCD), an Organic Light-Emitting Diode (OLED) display, and the like. The TFT-LCD controls rotating directions of liquid crystal molecules, to enable light in a backlight module to be refracted out to generate a picture, and the TFT-LCD has various advantages such as thin body, power saving, and no radiation. The OLED display is manufactured by using an organic electroluminescent diode, and has various advantages such as self-luminescent, short response time, high resolution and contrast, flexible display, and large area full color display.

However, a display device has many manufacturing processes and high precision, and inevitably, some display devices with poor quality may be manufactured. For example, a phenomenon of luminance shift or even luminance mura that causes various traces may occur. The product yield of the display devices is greatly reduced, and the gamma optical specifications of the display devices are controlled, so that the gamma optical performance of the display devices exceeds a control range. It is worthy of studying how to achieve a gamma parameter control specification while solving the luminance correction of a display panel.

SUMMARY

This application is directed to a luminance correction method and a luminance correction device for a display panel, intended to improve a gamma parameter control effect of a display panel while solving the luminance correction of the display panel.

To achieve the above object, this application provides a luminance correction method for a display panel, including the following steps:

collecting full-picture optical information: collecting full-picture optical information of at least one preset high-gray level picture, full-picture optical information of a low-gray level picture, and full-picture optical information of at least one medium-gray level picture;

calculating, according to the full-picture optical information of the high-gray level picture and the full-picture optical information of the low-gray level picture, target optical luminance values corresponding to medium-gray level pictures; and comparing the full-picture optical information of the medium-gray level pictures with a target optical luminance value corresponding to a current medium-gray level picture, and obtaining a gray level correction matrix corresponding to a current gray level.

This application also discloses a luminance correction device for a display panel, including:

an optical information collector, configured to collect full-picture optical information of at least one preset high-gray level picture, full-picture optical information of a low-gray level picture, and full-picture optical information of at least one medium-gray level picture:

a calculator, configured to calculate, according to the full-picture optical information of the high-gray level picture and the full-picture optical information of the low-gray level picture obtained by the optical information collector, target optical luminance values corresponding to medium-gray level pictures; and a gray level corrector, configured to compare the full-picture optical information of the medium-gray level pictures with a target optical luminance value corresponding to a current medium-gray level picture, and obtain a gray level correction matrix corresponding to a current gray level.

In this application, full-picture optical information of at least one high-gray level picture and full-picture optical information of a low-gray level picture are used as original data, target optical luminance values corresponding to medium-gray levels are calculated, and actual full-picture optical information of a medium-gray level picture is corrected to obtain a gray level correction matrix. Compared with a solution using actual full-picture optical information of a current gray level as a corresponding target optical luminance value, if an optical gamma offset is large due to a large uniformity difference of a display panel or the variation of the display panel itself, an optical luminance value of the actual full-picture optical information of a current gray level is used as a target optical luminance value, which may cause an optical luminance of a gray level-corrected display panel to exceed gamma control requirements. In this solution, corrected gray levels are calculated according to the specifications, which are more in line with the gamma control requirements of panel gray levels, thereby greatly reducing situations in which the gamma parameter specifications of the panel exceed gamma control during the gamma parameter specification detection process of the corrected gray levels of the display panel.

BRIEF DESCRIPTION OF DRAWINGS

The included accompanying drawings are used to provide further understanding to embodiments of this application, form a part of the specification, are examples of implementations of this application, and describe and explain a principle of this application together with this text. Apparently, the accompanying drawings in the following descriptions are merely some embodiments of this application, and a person of ordinary skill in the art can also obtain other accompanying drawings according to these accompanying drawings without involving any creative effort. In the accompanying drawings.

DETAILED DESCRIPTION OF EMBODIMENTS

Figure 1:
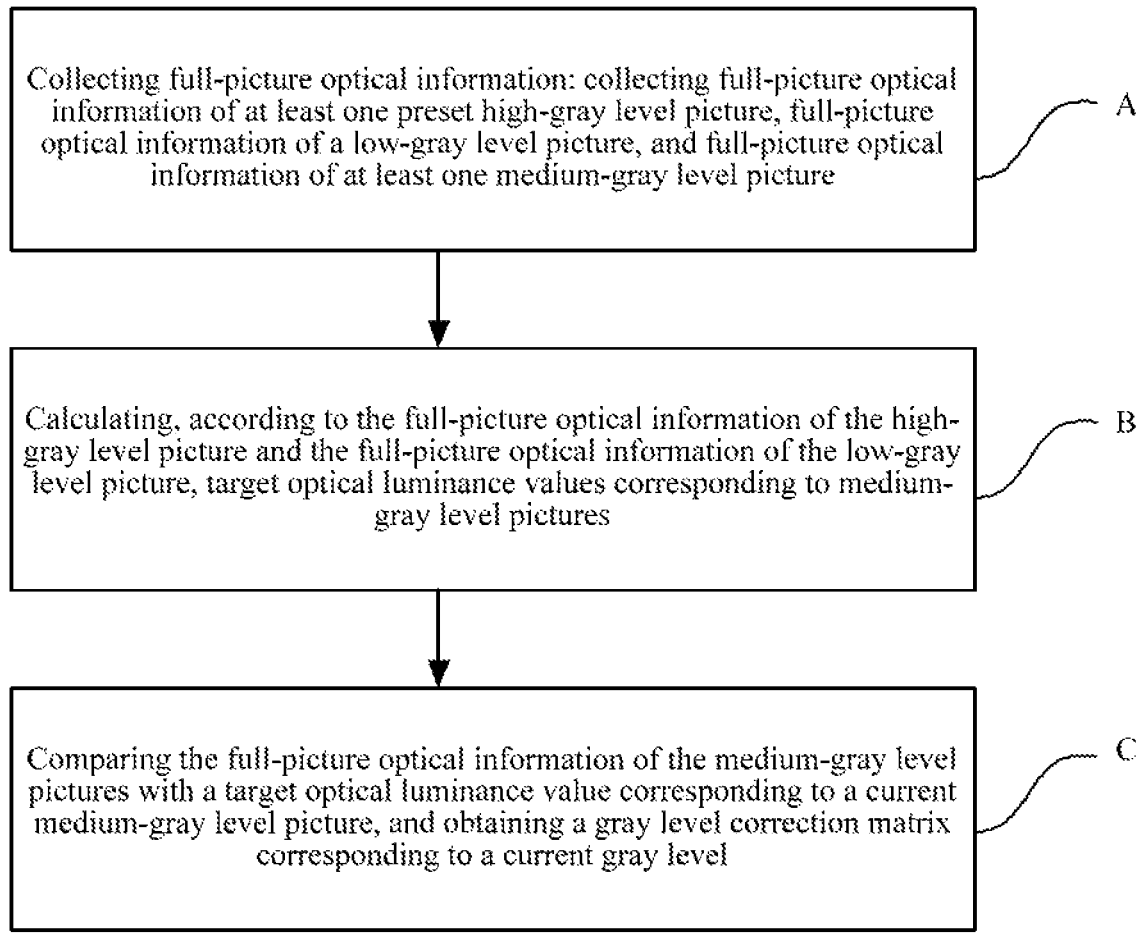
FIG. 1 is a schematic flowchart of a luminance correction method for a display panel according to an embodiment of this application.

Specific structures and functional details disclosed herein are merely representative, and are intended to describe the objectives of exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly includes one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

This application is further described below with reference to the accompanying drawings and optional embodiments.

Figure 10:
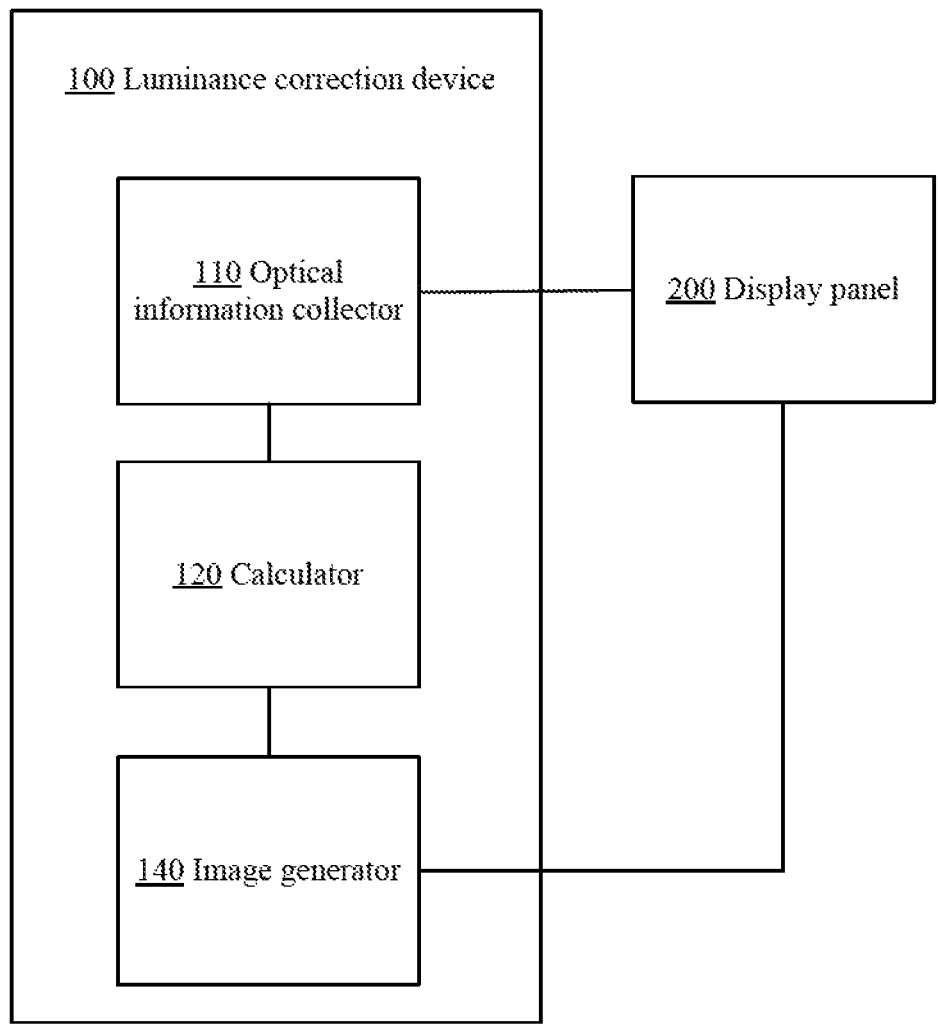
FIG. 10 is a schematic structure diagram of a luminance correction device for a display panel according to an embodiment of this application.

Referring to FIG. 1 and FIG. 10, an embodiment of this application discloses a display correction method for a display panel, including the following steps:

A: collecting full-picture optical information: collect full-picture optical information of at least one preset high-gray level picture, full-picture optical information of a low-gray level picture, and full-picture optical information of at least one medium-gray level picture;

B: calculating, according to the full-picture optical information of the high-gray level picture and the full-picture optical information of the low-gray level picture, target optical luminance values corresponding to medium-gray level pictures; and C: comparing the full-picture optical information of the medium-gray level pictures with a target optical luminance value corresponding to a current medium-gray level picture, and obtaining a gray level correction matrix corresponding to a current gray level.

In this solution, full-picture optical information of at least one high-gray level picture and full-picture optical information of a low-gray level picture are used as original data, target optical luminance values corresponding to medium-gray levels are calculated, and actual full-picture optical information of a medium-gray level picture is corrected to obtain a gray level correction matrix. Compared with a solution using actual full-picture optical information of a current gray level as a corresponding target optical luminance value, if an optical gamma offset is large due to a large uniformity difference of a display panel or the variation of the display panel itself, an optical luminance value of the actual full-picture optical information of a current gray level is used as a target optical luminance value, which may cause an optical luminance of a gray level-corrected display panel to exceed gamma control requirements. In this solution, corrected gray levels are calculated according to the specifications, which are more in line with the gamma control requirements of panel gray levels, thereby greatly reducing situations in which the gamma parameter specifications of the panel exceed gamma control during the gamma parameter specification detection process of the corrected gray levels of the display panel.

In this embodiment, alternatively, the step of calculating, according to the full-picture optical information of the high-gray level picture and the full-picture optical information of the low-gray level picture, target optical luminance values corresponding to medium-gray levels includes:

calculating, according to the full-picture optical information of the high-gray level picture and the full-picture optical information of the low-gray level picture, an average luminance value LvA of the high-gray level picture and an average luminance value LvB of the low-gray level picture; and according to Formula:

$$Lvm' = \left(\frac{m}{A}\right)^\gamma [LvA - LvB] + LvB$$

calculating a target luminance value lvm' corresponding to a medium m-gray level picture under a standard gamma parameter, where A and B are current gray level values, and γ is a preset standard gamma parameter of the display panel.

In this solution, the target luminance value lvm' of the medium m-gray level is calculated by the above formula according to the average luminance value LvA of the high-gray level picture and the average luminance value LvB of the low-gray level picture. The target luminance value of the medium m-gray level picture is a target luminance value in line with the standard gamma parameter. When the target luminance value is used in the subsequent steps, errors can be avoided, and the accuracy of gamma specification control can be improved.

In one or more embodiments, 0 to 32 gray levels fall within a gray level range of the low-gray level picture, and 223 to 255 gray levels fall within a gray level range of the high-gray level picture. In this solution, full-picture optical information of a low-gray level picture within the gray level range of 0 to 32 and a high-gray level picture within the gray level range of 223 to 255 is acquired firstly. Within the above gray level ranges, the target luminance values calculated by the above formula are relatively accurate, and are closer to an actual display effect of the display panel.

In this embodiment, alternatively, in the step of collecting full-picture optical information, the low-gray level picture is an entirely-black picture, and the high-gray level picture is an entirely-white picture. The entirely-black gray level picture and the entirely-white gray level picture cannot be luminance-compensated by adjusting data voltages of pixel electrodes corresponding to mura areas due to a data voltage range. Therefore, the entirely-black gray level picture and the entirely-white gray level picture at this time are truly displayed pictures. The actual full-picture optical information of pictures at both ends of this gray level is used as a calculation source of the target luminance value, so that the target optical luminance value corresponding to the medium-gray level of the display panel is more in line with the gamma control requirements.

In one or more embodiments, in the step of collecting full-picture optical information, the full-picture optical information of at least three different medium-gray level pictures is collected.

In the step of comparing the full-picture optical information of the medium-gray level pictures with a target optical luminance value corresponding to a current medium-gray level picture, and obtaining a gray level correction matrix corresponding to a current gray level, the three different medium-gray level pictures are compared respectively to obtain gray level correction matrices of the three different medium-gray level pictures.

Then, gray level correction matrices of other gray levels are obtained by an interpolation operation.

In this solution, an interpolation operation is performed on three medium-gray level pictures to obtain gray level correction matrices of other gray levels pictures. In such a manner of comparing gray level picture detections one by one and calculating correction matrices, the detection correction process of this solution is faster, and the calculated gray level correction matrices of full-gray level pictures are under a standard value. Therefore, a correction effect is very good.

In one or more embodiments, during the calculation of an average luminance value LvA of the high-gray level picture and an average luminance value LvB of the low-gray level picture, average values are calculated by selecting a K*Q central area of a gray level picture, where K represents a height of the gray level picture, and Q represents a width of the gray level picture.

In this solution, the quality of the display panel is usually evaluated by capturing optical information of a central area of a displayed gray level picture during the quality detection process of the display panel. During the correction process, the average luminance value of the high-gray level picture and the average luminance value of the low-gray level picture are calculated by selecting the optical information of the K*Q central area of the gray level picture. Thus, after subsequent comparison correction, the gray level picture displayed by the display panel is more in line with a luminance under the standard gamma parameter.

The central area may adopt an area with the same height and width, that is, a central area (K=Q). Of course, a central area in which K is not equal to Q may also be selected, and a central area in which K is proportional to Q along with the resolution of the display panel is selected. Those skilled in the art can flexibly select the range of values of K and Q according to the characteristics and actual needs of the display panel.

On the other hand, since the attention of a human eye to an intermediate area of a display picture is more sensitive than the attention to a non-intermediate area, a central area of the display picture is selected to calculate the required value in the correction process, and the luminance of a full picture is in line with the comfort of the attention of the human eye, which helps to enhance the visual experience.

In one or more embodiments, the luminance correction method for a display panel further includes the following steps:

driving, by the display panel, according to a compensated luminance value of each pixel in each gray level correction matrix, an actually input picture with a compensated and corrected luminance, and displaying the actually input picture; and performing gamma parameter specification confirmation on corrected gray level pictures, where if a gamma parameter specification of the display panel is confirmed to be unqualified, a feedback about the disqualification is given, and if the gamma parameter specification is confirmed to be qualified, the method proceeds to the subsequent stage.

In this solution, if a gamma parameter specification of the display panel is confirmed to be unqualified, a feedback about the disqualification is given. Thus, an inspection personnel is reminded to perform rework processing or other correction processing on the unqualified display panel, thereby improving the detection rate of the inspection personnel, and preventing a display panel of poor quality from flowing into the subsequent process to increase the production difficulty of a production line. If the gamma parameter specification is confirmed to be qualified, the method proceeds to the subsequent stage, so that the detection speed of the inspection personnel can be increased, which is advantageous for improving the production efficiency.

In one or more embodiments, the step of comparing the full-picture optical information of the medium-gray level pictures with a target optical luminance value corresponding to a current medium-gray level picture, and obtaining a gray level correction matrix corresponding to a current gray level includes:

comparing a target luminance value of a current gray level picture with an actual optical luminance value of each pixel of the current gray level picture, calculating a compensated luminance value of each pixel of the current gray level picture, and obtaining a gray level correction matrix corresponding to the current gray level picture respectively.

In this solution, a target luminance value of a current gray level picture is calculated and compared with an actual optical luminance value of each pixel of the current gray level picture, a compensated luminance value of each pixel of the current gray level picture is calculated, and a gray level correction matrix corresponding to the current gray level picture is obtained respectively. After the luminance correction, the situation of display mura of a display panel can be obviously improved, or the situation of overall luminance shift of a display panel not having the problem of display mura can even be improved by the luminance correction. By such a design, the situation that the gamma parameter specification of the display panel exceeds gamma control can be taken into consideration after the luminance correction.

Another embodiment of this application discloses a display luminance correction method for a display panel, including the following steps:

collecting full-picture optical information, including: collecting full-picture optical information of a preset entirely-white gray level picture, full-picture optical information of an entirely-black gray level picture, and full-picture optical information of an m-gray level picture, an n-gray level picture and a g-gray level picture, where m, n and g are gray level values, and 0<m<n<g<255;

calculating, according to the full-picture optical information of the entirely-white gray level picture and the full-picture optical information of the entirely-black gray level picture, an average luminance value Lv255 of the entirely-white gray level picture and an average luminance value Lv0 of the entirely-black gray level picture;

according to Formulas:

$$Lvm' = \left(\frac{m}{255}\right)^\gamma [Lv255 - Lv0] + Lv0$$
$$Lvn' = \left(\frac{n}{255}\right)^\gamma [Lv255 - Lv0] + Lv0$$
$$Lvg' = \left(\frac{g}{255}\right)^\gamma [Lv255 - Lv0] + Lv0$$

calculating target luminance values lvm', lvn' and lvg' corresponding to the m-gray level picture, the n-gray level picture and the g-gray level picture under a standard gamma parameter, where m, n and g are current gray level values, and γ is a preset standard gamma parameter of the display panel;

comparing the target optical luminance values lvm', lvn' and lvg' corresponding to the m-gray level picture, the n-gray level picture and the g-gray level picture with actual optical luminance values Lvm (i, j), Lvn (i, j) and Lvg (i, j) of respective pixels of the m-gray level picture, the n-gray level picture and the g-gray level picture to obtain gray level correction matrices corresponding to the m-gray level picture, the n-gray level picture and the g-gray level picture;

and then, obtaining gray level correction matrices of other gray levels by an interpolation operation.

Figure 2:
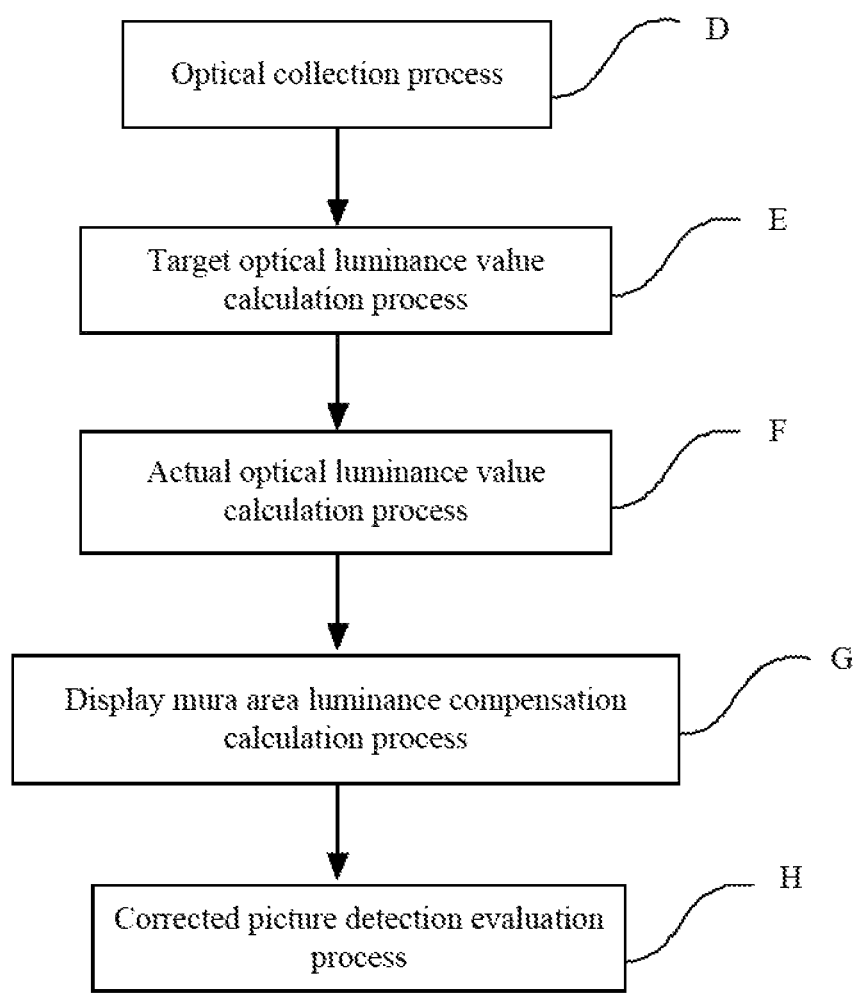
FIG. 2 is a schematic flowchart of a luminance correction method for a display panel according to another embodiment of this application.
Figure 3:
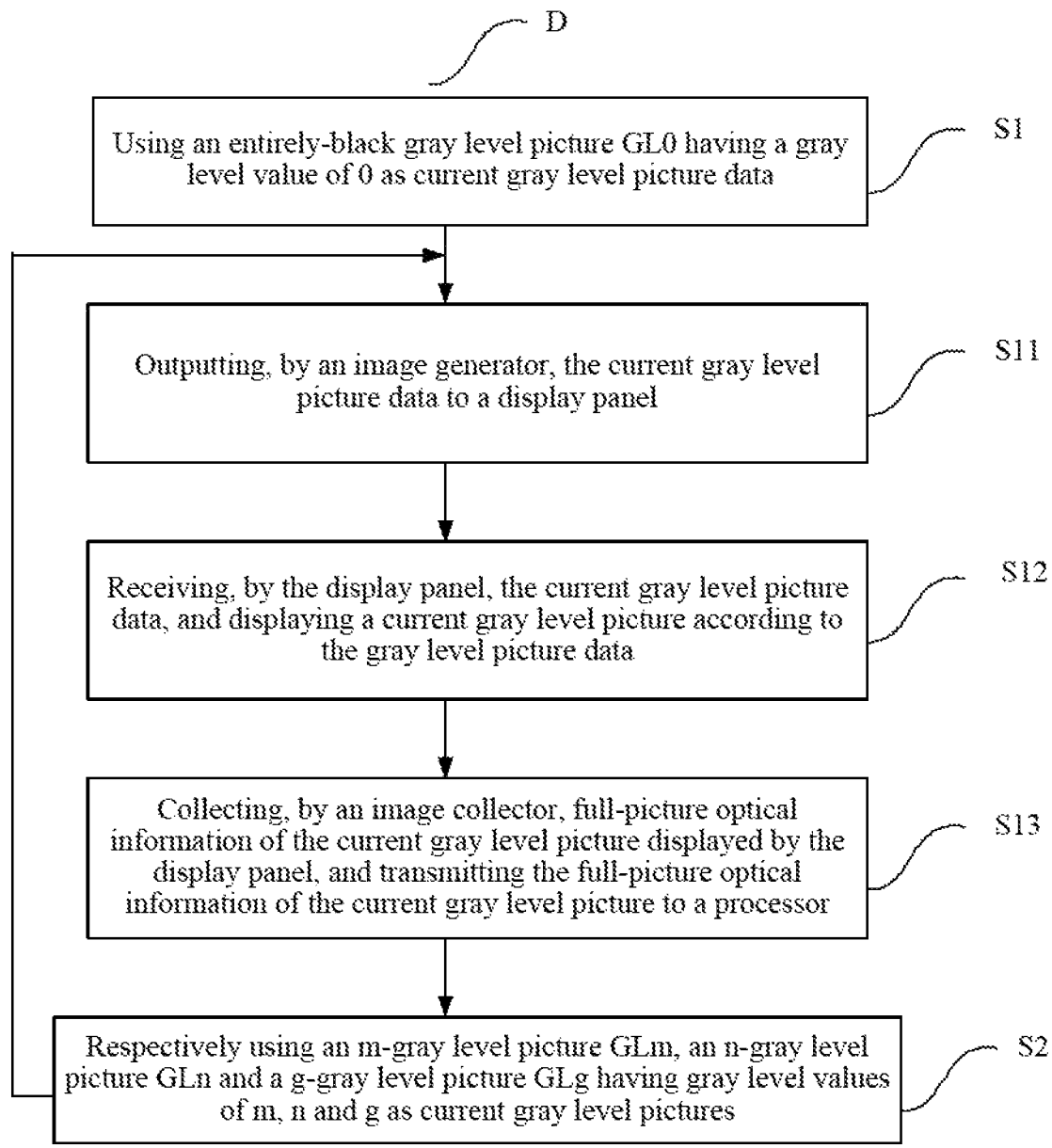
FIG. 3 is a schematic flowchart of an optical collection process according to an embodiment of this application.
Figure 4:
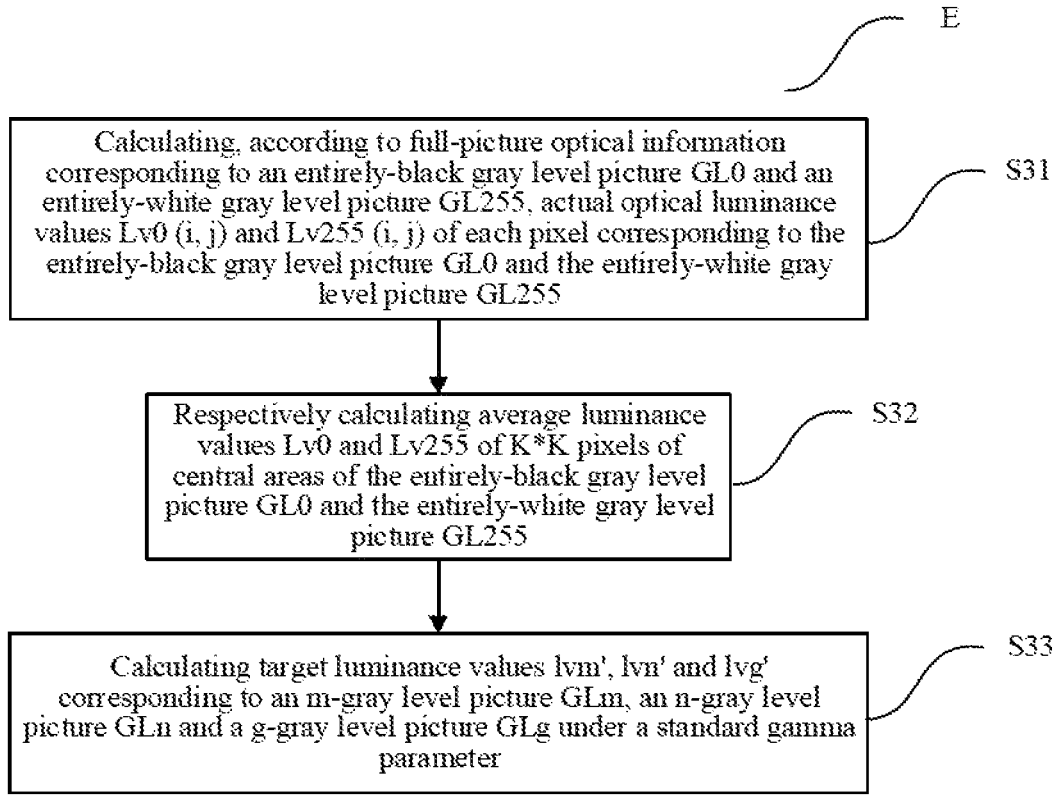
FIG. 4 is a schematic diagram of a calculation process of a target optical luminance value according to an embodiment of this application.
Figure 5:
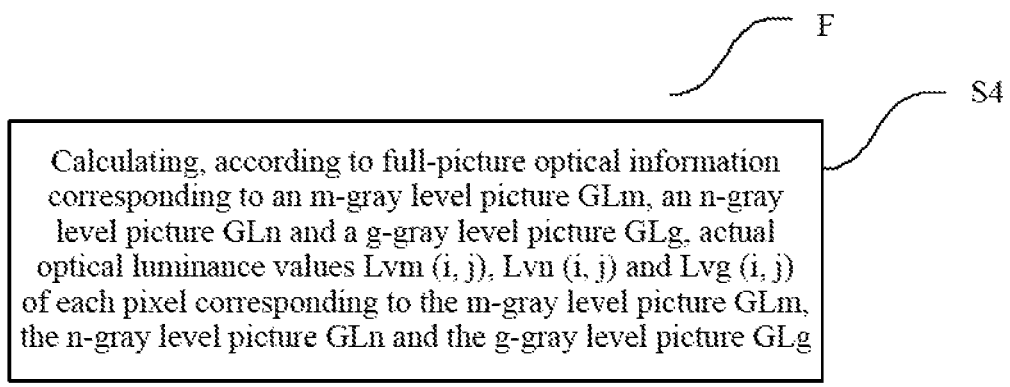
FIG. 5 is a schematic diagram of a calculation process of an actual optical luminance value according to an embodiment of this application.
Figure 6:
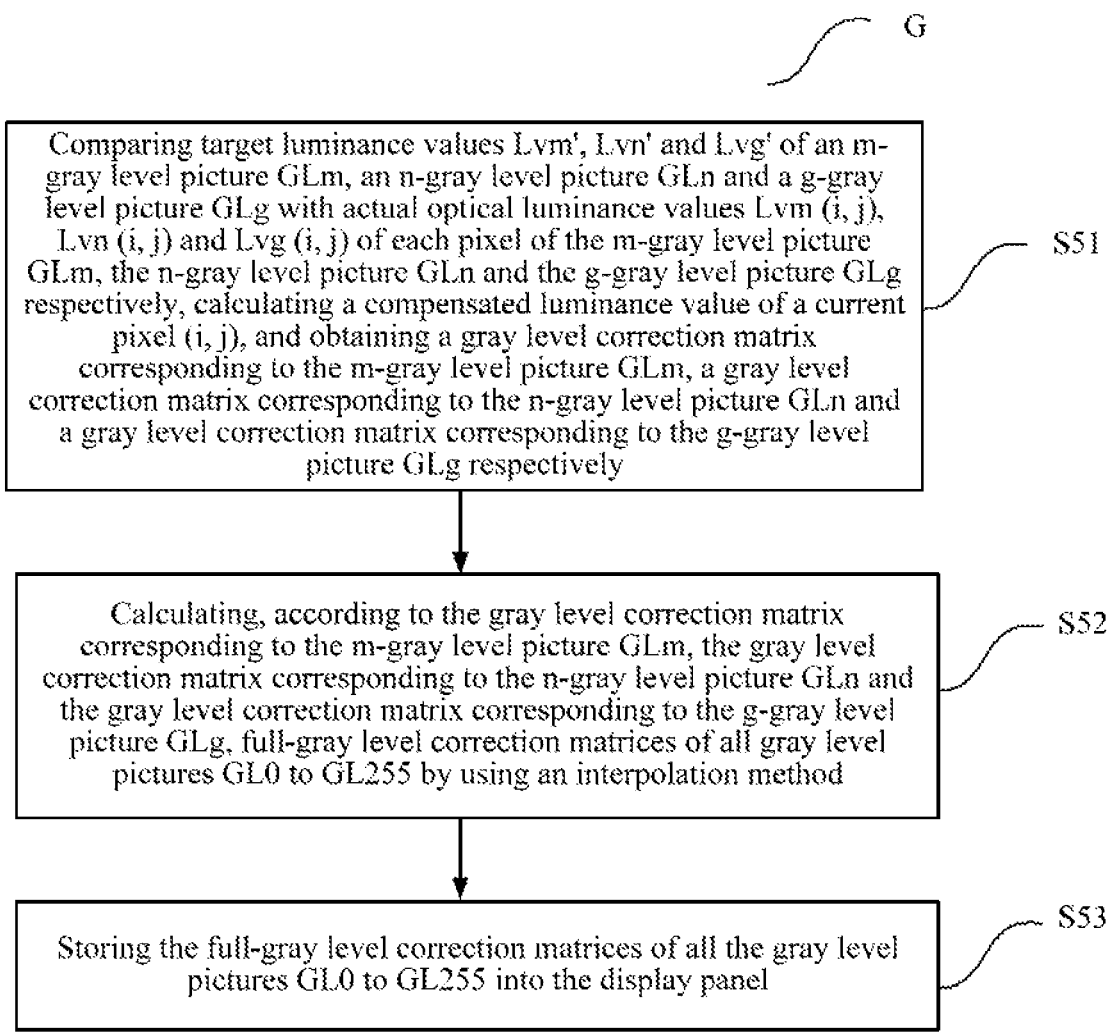
FIG. 6 is a schematic diagram of a luminance compensation process calculator for a display mura area according to an embodiment of this application.
Figure 7:
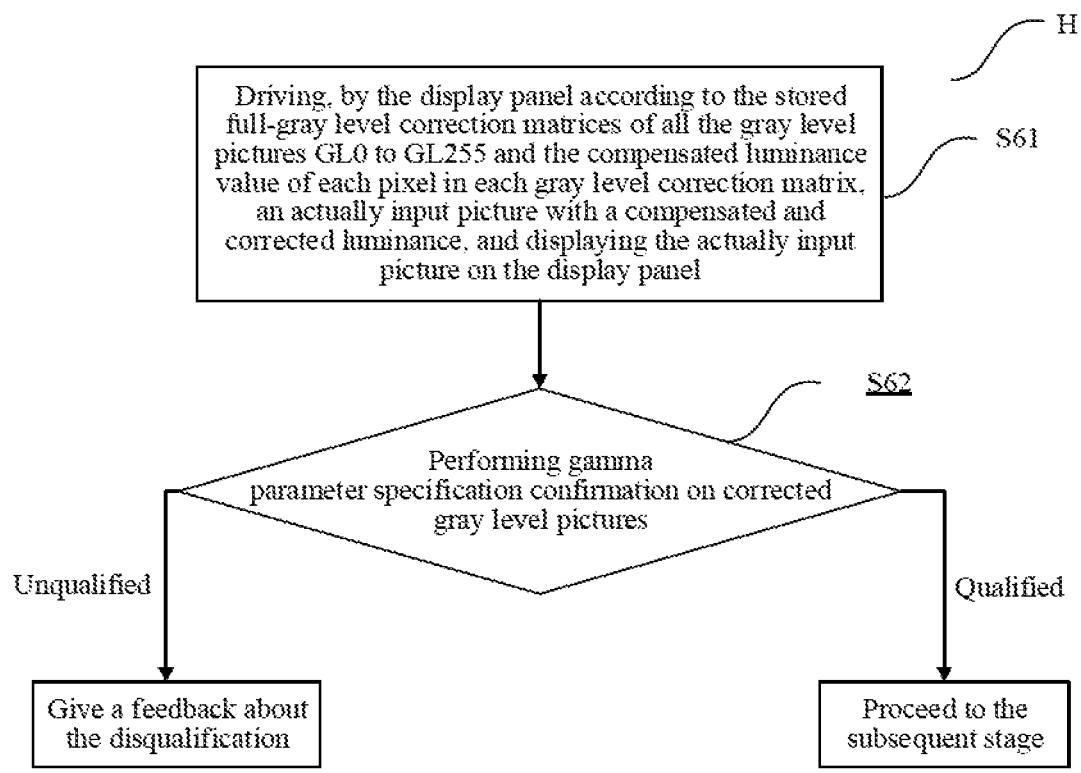
FIG. 7 is a schematic diagram of a corrected picture detection evaluation process according to an embodiment of this application.
Figure 8:
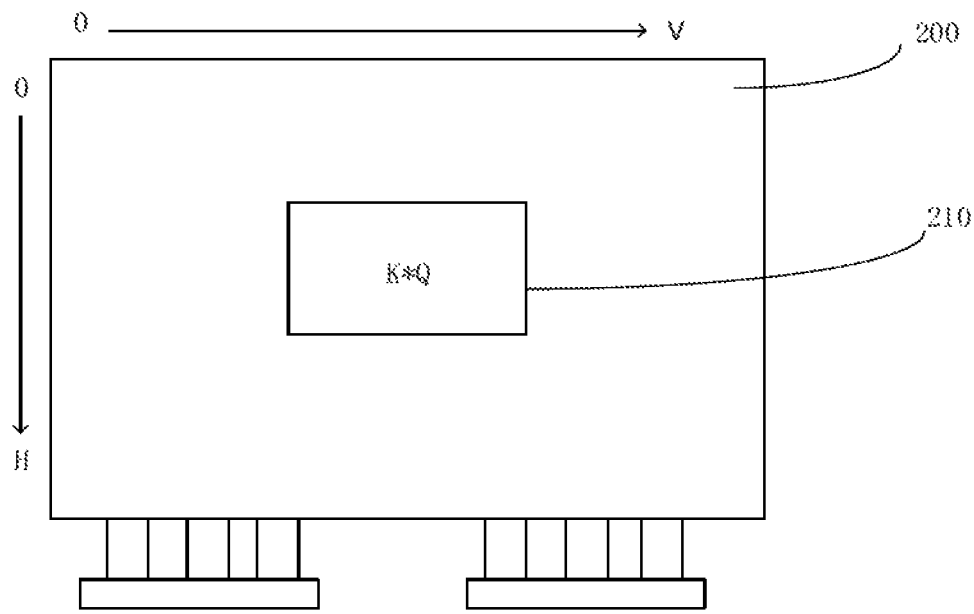
FIG. 8 is a schematic diagram of a central area position of a display panel according to an embodiment of this application.
Figure 9:
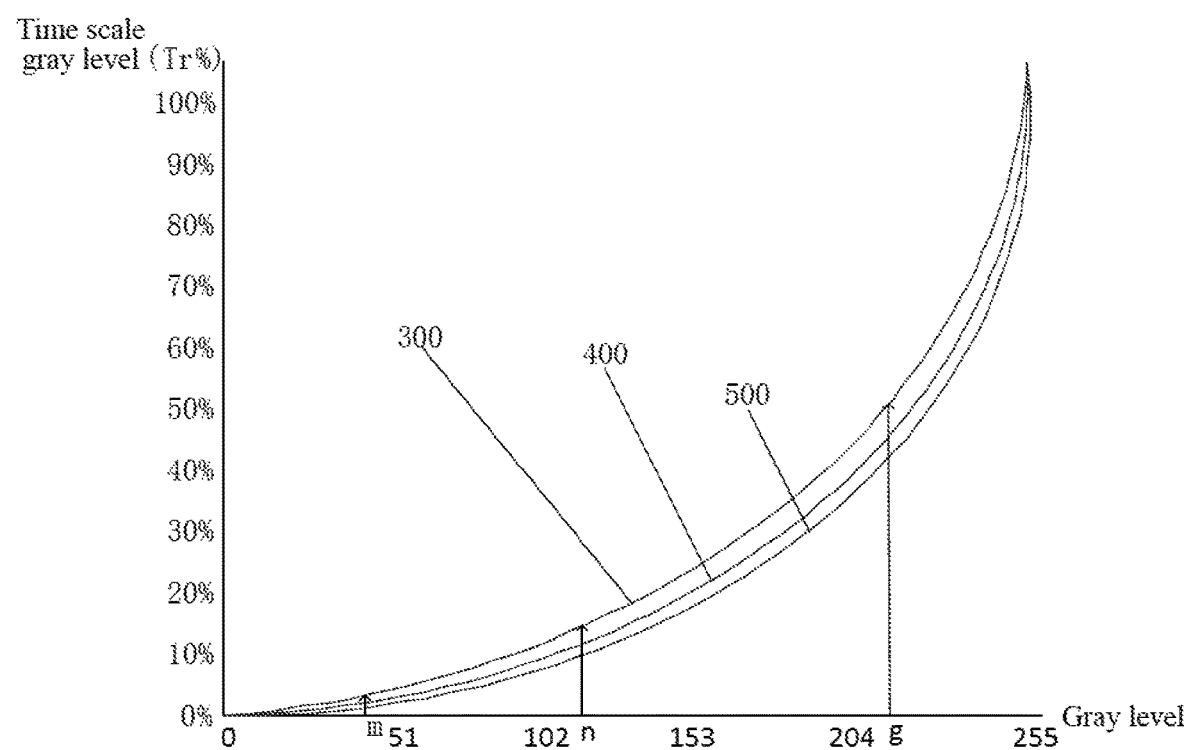
FIG. 9 is a schematic diagram of a standard gamma curve before and after correction according to an embodiment of this application.

As shown in FIG. 2 and FIG. 7, another embodiment of this application discloses a display correction method for a display panel, including:

Optical Collection Process:

S1: performing, using an entirely-black gray level picture GL0 having a gray level value of 0 as current gray level picture data, the following steps:

S11: outputting, by an image generator, the current gray level picture data to a display panel;

S12: receiving, by the display panel, the current gray level picture data, and displaying a current gray level picture according to the gray level picture data; and S13: collecting, by an image collector, full-picture optical information of the current gray level picture displayed by the display panel, and transmitting the full-picture optical information of the current gray level picture to a processor; and S2: performing, respectively using an entirely-white gray level picture GL255 having a gray level value of 255 as well as at least three different gray level pictures namely an m-gray level picture GLm, an n-gray level picture GLn and a g-gray level picture GLg having gray level values of m, n and g (0<m<n<g<255) among the entirely-black gray level picture GL0 to the entirely-white gray level picture GL255 as current gray level pictures, step S11 until all images are collected completely.

Target Optical Luminance Value Calculation Process:

S31: calculating, by the processor, according to fill-picture optical information corresponding to the entirely-black gray level picture GL0 and the entirely-white gray level picture GL255, actual optical luminance values Lv0 j) and Lv255 (i, j) of each pixel corresponding to the entirely-black gray level picture GL0 and the entirely-white gray level picture GL255, where 0≤i≤H, 0≤j≤V, H represents a total number of rows of a current gray level picture, i represents an ith row of the current gray level picture, V represents a total number of columns of the current gray level picture, and j represents a jth column of the current gray level picture;

S32: respectively calculating average luminance values Lv0 and Lv255 of central areas of the entirely-black gray level picture GL0 and the entirely-white gray level picture GL255, where the central areas may be K*K pixels: and S33: calculating target luminance values lvm', lvn' and lvg' corresponding to the m-gray level picture GLm, the n-gray level picture GLn and the g-gray level picture GLg under a standard gamma parameter according to Formulas: where the formulas are:

$$Lvm' = \left(\frac{m}{255}\right)^\gamma [Lv255 - Lv0] + Lv0$$
$$Lvn' = \left(\frac{n}{255}\right)^\gamma [Lv255 - Lv0] + Lv0$$
$$Lvg' = \left(\frac{g}{255}\right)^\gamma [Lv255 - Lv0] + Lv0$$

Actual Optical Luminance Value Calculation Process:

S4: calculating, by the processor, according to full-picture optical information corresponding to the m-gray level picture GLm, the n-gray level picture GLn and the g-gray level picture GLg, actual optical luminance values Lvm (i, j), Lvn (i, j) and Lvg (i, j) of each pixel corresponding to the n-gray level picture GLm, the n-gray level picture GLn and the g-gray level picture GLg, where 0≤i≤H, 0≤j≤V, H represents a total number of rows of a current gray level picture, i represents an ith row of the current gray level picture, V represents a total number of columns of the current gray level picture, and j represents a jth column of the current gray level picture.

Display Mura Area Luminance Compensation Calculation Process: (Generate Gray Level Correction Matrices of Three Medium-Gray Level Pictures)

S51: comparing, by the processor, the target luminance values lvm', lvn' and lvg' of the n-gray level picture GLm, the n-gray level picture GLn and the g-gray level picture GLg with the actual optical luminance values Lvm (i, j), Lvn (i, j) and Lvg (i, j) of each pixel of the m-gray level picture GLm, the n-gray level picture GLn and the g-gray level picture GLg respectively, calculating a compensated luminance value of a current pixel (i, j), and obtaining a gray level correction matrix corresponding to the m-gray level picture GLm, a gray level correction matrix corresponding to the n-gray level picture GLn and a gray level correction matrix corresponding to the g-gray level picture GLg respectively, where especially for a display mura area of the display panel, the actual optical luminance value Lvm (i, j) of the current pixel may be higher than or lower than the target luminance value, and after the compensated luminance value of the current pixel is calculated, the actual gray level value is compensated according to the compensated luminance value, so that an over-high or over-low actual optical luminance can be corrected to an expected target luminance value;

S52: calculating, according to the gray level correction matrix corresponding to the m-gray level picture GLm, the gray level correction matrix corresponding to the n-gray level picture GLn and the gray level correction matrix corresponding to the g-gray level picture GLg, full-gray level correction matrices of all gray level pictures GL0 to GL255 by using an interpolation method; and S53: storing the full-gray level correction matrices of all the gray level pictures GL0 to GL255 into the display panel.

Corrected Picture Detection Evaluation Process:

S61: driving, by the display panel, according to the stored full-gray level correction matrices of all the gray level pictures GL0 to GL255 and the compensated luminance value of each pixel in each gray level correction matrix, an actually input picture with a compensated and corrected luminance, and displaying the actually input picture; and S62: performing gamma parameter specification confirmation on corrected gray level pictures, where if a gamma parameter specification of the display panel is confirmed to be unqualified, a feedback about the disqualification is given, and if the gamma parameter specification is confirmed to be qualified, the flow proceeds to the subsequent stage.

In this solution, the full-picture optical information of the entirely-black gray level picture GL0 and the entirely-white gray level picture GL255 is measured by an optical instrument, and the target luminances of luminance information of the m-gray level picture GLm, the n-gray level picture GLn and the g-gray level picture GLg are calculated according to the actual luminance values of the entirely-black gray level picture GL0 and the entirely-white gray level picture GL255. Therefore, optical gamma shift of the display panel caused by non-correspondence of the target luminances of the luminance information of the m-gray level picture GLm, the n-gray level picture GLn and the g-gray level picture GLg to target luminance values under standard gamma due to errors between the optical luminance during the actual display of the luminance information of the m-gray level picture GLm, the n-gray level picture GLn and the g-gray level picture GLg and an expected display luminance can be avoided. The target luminances of the luminance information of the m-gray level picture GLm, the n-gray level picture GLn and the g-gray level picture GLg are calculated, compensation luminance values are obtained according to actual luminance values of the target luminances of the luminance information of the n-gray level picture GLm, the n-gray level picture GLn and the g-gray level picture GLg, gray level correction matrices of the gray level pictures such as the m-gray level picture GLm, the n-gray level picture GLn and the g-gray level picture GLg are calculated according to the compensation luminance values of the n-gray level picture GLm, the n-gray level picture GLn and the g-gray level picture GLg, and correction is performed finally according to the gray level correction matrices. The corrected optical gamma of the display panel is closer to the standard optical gamma, thereby avoiding influence on the quality of the display panel caused by the fact that the optical gamma of the display panel exceeds a standard specification after the mura of the display panel is eliminated due to a large difference of the display panel itself.

As another embodiment of this application, referring to FIG. 10, disclosed is a luminance correction device 100 for a display panel 200 using the above correction method, including:

an image generator 140, configured to generate a specific preset picture to a display panel 200 to be detected, and drive the display panel 200 to display the preset picture, the specific preset picture including, but not limited to, a high-gray level picture such as an entirely-white picture, a low-gray level picture such as an entirely-black picture, and a plurality of medium-gray level pictures such as full pictures with the same gray level value;

an optical information collector 110, e.g., a camera or another optical collector, configured to collect full-picture optical information of at least one preset high-gray level picture, full-picture optical information of a low-gray level picture, and full-picture optical information of at least one medium-gray level picture;

a calculator 120, e.g., a computer or a processor, configured to calculate, according to the full-picture optical information of the high-gray level picture and the full-picture optical information of the low-gray level picture obtained by the optical information collector, target optical luminance values corresponding to medium-gray level pictures; and a gray level corrector 130, e.g., a computer or a processor, configured to compare the full-picture optical information of the medium-gray level pictures with a target optical luminance value corresponding to a current medium-gray level picture, and obtain a gray level correction matrix corresponding to a current gray level.

It should be noted that the limitation of each step involved in this solution is not determined to limit the sequence of steps without affecting the implementation of a specific solution. The previous steps may be performed first, or may be performed later, or may be performed even simultaneously. As long as this solution can be implemented, it should be considered as falling within the protection scope of this application.

The technical solution of this application may be widely applied to various display panels such as a Twisted Nematic (TN) display panel, an In-Plane Switching (IPS) display panel, a Vertical Alignment (VA) display panel, or a Multi-Domain Vertical Alignment (MVA) display panel, and may certainly be applied to other types of display panels such as an Organic Light-Emitting Diode (OLED) display panel, which may be applied to the above solution.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A luminance correction method for a display panel, comprising the following steps:
    collecting full-picture optical information: collecting full-picture optical information of at least one preset high-gray level picture, full-picture optical information of a low-gray level picture, and full-picture optical information of at least one medium-gray level picture;
    calculating, according to the full-picture optical information of the high-gray level picture and the full-picture optical information of the low-gray level picture, target optical luminance values corresponding to medium-gray level pictures; and
    calculating display mura area luminance compensation:
    comparing the full-picture optical information of the medium-gray level pictures with a target optical luminance value corresponding to a current medium-gray level picture, and obtaining a gray level correction matrix corresponding to a current gray level;
    wherein in the step of collecting full-picture optical information, the full-picture optical information of at least three different medium-gray level pictures namely an m-gray level picture GLm, an n-gray level picture GLn and a g-gray level picture GLg having gray level values of m, n and a (0<m<n<g<255) is collected; and
    calculating, target luminance values lvm', lvn' and lvg' corresponding to the m-gray level picture GLm, the n-gray level picture GLn and the g-gray level picture GLg under a standard gamma parameter according to Formulas:
    where the formulas are:

$$Lvm' = \left(\frac{m}{255}\right)^\gamma [Lv255 - Lv0] + Lv0$$

$$Lvn' = \left(\frac{n}{255}\right)^\gamma [Lv255 - Lv0] + Lv0$$

$$Lvg' = \left(\frac{g}{255}\right)^\gamma [Lv255 - Lv0] + Lv0$$

calculating, according to full-picture optical information corresponding to the m-gray level picture GLm, the n-gray level picture GLn and the g-gray level picture GLg, actual optical luminance values Lvm (i, j), Lvn (i, j) and Lvg (i, j) of each pixel corresponding to the m-gray level picture GLm, the n-gray, level picture GLn and the g-gray level picture GLg, where 0<i<H, 0<j<V, H represents a total number of rows of a current gray level picture, i represents an ith row of the current gray level picture, V represents a total number of columns of the current gray level picture, and j represents a jth column of the current gray level picture;
    in the step of calculating display mura area luminance compensation:
    comparing, by the processor, the target luminance values lvm', lvn' and lvg' of the m-gray level picture GLm, the n-gray level picture GLn and the g-gray level picture GLg with the actual optical luminance values Lvm (i, j), Lvn (i, j) and Lvg (i, j) of each pixel of the m-gray level picture GLm, the n-gray level picture GLn and the g-gray level picture GLg respectively, calculating a compensated luminance value of a current pixel (i, j), and obtaining a gray level correction matrix corresponding to the m-gray level picture GLm, a gray level correction matrix corresponding to the n-gray level picture GLn and a gray level correction matrix corresponding to the g-gray level picture GLg respectively.

2. The luminance correction method for a display panel according to claim 1, wherein 0 to 32 gray levels fall within a gray level range of the low-gray level picture; and
    223 to 255 gray levels fall within a gray level range of the high-gray level picture.

3. The luminance correction method for a display panel according to claim 1, wherein in the step of collecting full-picture optical information, the low-gray level picture is an entirely-black picture.

4. The luminance correction method for a display panel according to claim 3, wherein in the step of collecting full-picture optical information, the high-gray level picture is an entirely-white picture.

5. The luminance correction method for a display panel according to claim 1, wherein after the three different gray levels are compared respectively to obtain gray level correction matrices corresponding to the three different gray levels in the step of comparing the full-picture optical information of the medium-gray level pictures with a target optical luminance value corresponding to a current medium-gray level picture, and obtaining a gray level correction matrix corresponding to a current gray level, the method further comprises:
    performing an interpolation operation to obtain gray level correction matrices of other gray levels.

6. The luminance correction method for a display panel according to claim 1, wherein during the calculation of an average luminance value LvA of the high gray level picture and an average luminance value LvB of the low-gray level picture, average values are calculated by selecting a K*Q central area of a gray level picture,
    where K represents a height of the gray level picture, and Q represents a width of the gray level picture.

7. The luminance correction method for a display panel according to claim 6, wherein the height of the gray level picture of the K*Q central area is equal to the width of the gray level picture.

8. The luminance correction method for a display panel according to claim 6, Wherein the height of the gray level picture of the K*Q central area is proportional to the width of the gray level picture.

9. The luminance correction method for a display panel according to claim 1, further comprising the following steps:
    driving, according to a compensated luminance value of each pixel in each gray level correction matrix, an actually input picture with a compensated and corrected luminance, and displaying the actually input picture on the display panel.

10. The luminance correction method for a display panel according to claim 9, wherein after driving, according to a compensated luminance value of each pixel in each gray level correction matrix, an actually input picture with a compensated and corrected luminance and displaying the actually input picture on the display panel, the method comprises:
    performing gamma parameter specification confirmation on corrected gray level pictures.

11. The luminance correction method for a display panel according to claim 10, wherein after performing gamma parameter specification confirmation on corrected gray level pictures, the method comprises:
if a gamma parameter specification of the display panel confirmed to be unqualified, giving a feedback about the disqualification.

12. The luminance correction method for a display panel according to claim 10, wherein after driving, according to a compensated luminance value of each pixel in each gray level correction matrix, an actually input picture with a compensated and corrected luminance and displaying the actually input picture on the display panel, the method comprises:
if the gamma parameter specification is confirmed to be qualified, proceeding to the subsequent stage.

13. The luminance correction method for a display panel according to claim 1, wherein the step of comparing the full-picture optical information of the medium-gray level pictures with a target optical luminance value corresponding to a current medium-gray level picture, and obtaining a gray level correction matrix corresponding to a current gray level comprises:
comparing a target luminance value of a current gray level picture with an actual optical luminance value of each pixel of the current gray level picture, calculating a compensated luminance value of a current pixel, and respectively obtaining a gray level correction matrix corresponding to the current gray level picture.

14. A luminance correction method for a display panel, comprising the following steps:
optical collection process:
performing, using an entirely-black gray level picture GL0 having a gray level value of 0 as current gray level picture data, the following steps:
outputting, by an image generator, the current gray level picture data to a display panel;
receiving, by the display panel, the current gray level picture data, and displaying a current gray level picture according to the gray level picture data; and
collecting, by an image collector, full-picture optical information of the current gray level picture displayed by the display panel, and transmitting the full-picture optical information of the current gray level picture to a processor; and
performing, respectively using an entirely-white gray level picture GL255 having a gray level value of 255 as well as at least three different gray level pictures namely an m-gray level picture GLm, an n-gray level picture GLn and a g-gray level picture GLg having gray level values of m, n and g (0<m<n<g<255) among the entirely-black gray level picture GL0 to the entirely-white gray level picture GL255 as current gray level pictures, step S11 until all images are collected completely;
target optical luminance value calculation process:
calculating, by the processor, according to full-picture optical information corresponding to the entirely-black gray level picture GL0 and the entirely-white gray level picture GL255, actual optical luminance values Lv0 (i, j) and Lv255 (i, j) Of each pixel corresponding to the entirely-black gray level picture GL0 and the entirely-white gray level picture GL255, where 0≤i≤H, 0≤j≤V, H represents a total number of rows of a current gray level picture, i represents an ith row of the current gray level picture, V represents a total number of columns of the current gray level picture, and j represents a jth column of the current gray level picture;
respectively calculating average luminance values Lv0 and Lv255 of central areas of the entirely-black gray level picture GL0 and the entirely-white gray level picture GL255, where the central areas may be K*K pixels; and
calculating target luminance values lvm', lvn' and lvg' corresponding to the m-gray level picture GLm, the n-gray level picture GLn and the g-gray level picture GLg under a standard gamma parameter according to Formulas:
where the formulas are:

$$Lvm' = \left(\frac{m}{255}\right)^{\gamma}[Lv255 - Lv0] + Lv0$$

$$Lvn' = \left(\frac{n}{255}\right)^{\gamma}[Lv255 - Lv0] + Lv0$$

$$Lvg' = \left(\frac{g}{255}\right)^{\gamma}[Lv255 - Lv0] + Lv0$$

actual optical luminance value calculation process:
calculating, by the processor, according to full-picture optical information corresponding to the m-gray level picture GLm, the n-gray level picture GLn and the g-gray level picture GLg, actual optical luminance values Lvm (i, j), Lvn (i, j) and Lvg (i, j) of each pixel corresponding to the m-gray level picture GLm, the n-gray level picture GLn and the g-gray level picture GLg, where 0≤i≤H, 0≤j≤V, H represents a total number of rows of a current gray level picture, i represents an ith row of the current ray level picture, V represents a total number of columns of the current gray level picture, and j represents a jth column of the current gray level picture;
display mura area luminance compensation calculation process: (generate gray level correction matrices of three medium-gray level pictures)
comparing, by the processor, the target luminance values lvm', lvn' and lvg' of the m-gray level picture GLm, the n-gray level picture GLn and the g-gray level picture GLg with the actual optical luminance values Lvm (i, j), Lvn (i, j) and Lvg (i, j) of each pixel of the m-gray level picture GLm, the n-gray level picture GLn and the g-gray level picture GLg respectively, calculating a compensated luminance value of a current pixel (i, j), and obtaining a gray level correction matrix corresponding to the m-gray level picture GLm, a gray level correction matrix corresponding to the n-gray level picture GLn and a gray level correction matrix corresponding to the g-gray level picture GLg respectively, where especially for a display mura area of the display panel, the actual optical luminance value Lvm (i, j) of the current pixel may be higher than or lower than the target luminance value, and after the compensated luminance value of the current pixel is calculated, the actual gray level value is compensated according to the compensated luminance value, so that an over-high or over-low actual optical luminance can be corrected to an expected target luminance value;
calculating, according to the gray level correction matrix corresponding to the m-gray level picture GLm, the gray level correction matrix corresponding to the n-gray level picture GLn and the gray level correction matrix corresponding to the g-gray level picture GLg, full-gray level correction matrices of all gray level pictures GL0 to GL255 by using an interpolation method; and storing the full-gray level correction matrices of all the gay level pictures GL0 to GL255 into the display panel;

corrected picture detection evaluation process:

driving, by the display panel, according to the stored full-gray level correction matrices of all the gray level pictures GL0 to GL255 and the compensated luminance value of each pixel in each gray level correction matrix, an actually input picture with a compensated and corrected luminance, and displaying the actually input picture; and performing gamma parameter specification confirmation on corrected gray level pictures, where if a gamma parameter specification of the display panel is confirmed to be unqualified, a feedback about the disqualification is given, and if the gamma parameter specification is confirmed to be qualified, the flow proceeds to the subsequent stage.

\* \* \* \* \*